United States Patent Office 3,264,103

Patented August 2, 1966

3,264,103

PHOTOPOLYMERIZABLE RELIEF PRINTING PLATES DEVELOPED BY DRY THERMAL TRANSFER

Abraham Bernard Cohen, Springfield, and Vincent Joseph Webers, Red Bank, N.J., assignors to E. I. du Pont de Nemours and Company, Wilmington, Del., a corporation of Delaware No Drawing. Filed June 27, 1962, Ser. No. 205,566
6 Claims. (Cl. 96—28)

This invention relates to a process for preparing relief images suitable for direct use as printing plates, and, more particularly, to a process for preparing such relief images employing a photopolymerization step.

Solid compositions capable of photopolymerization to rigid, insoluble, tough, structures are useful in making printing plates and are described in U.S. Patent 2,791,504. Printing plates with uniform printing height can be produced directly by exposing to actinic light, through an image-bearing process transparency, a photopolymerizable layer coated on a suitable support, until substantially complete polymerization of the composition occurs in the exposed areas with substantially no polymerization in the non-exposed areas. Portions of the layer in the latter areas are generally removed by treatment with a suitable solvent in which the polymerized composition in the exposed areas is insoluble leaving a relief image of the text of the transparency suitable for direct use as a printing plate, especially for letter press work or dry off-set. This operation is called "development." Solvent development is inherently a wet operation and when organic solvents are used there are toxicity and flammability problems which usually involve additional hazards and equipment.

An object of this invention is to provide an improved process for preparing photopolymerized printing elements. A further object is to provide such a process which is simple, quick and utilizes standard equipment. A more specific object is to provide a completely dry process for developing the exposed photopolymerizable element by removal of the normally solid unexposed areas.

These and other objects are attained in accordance with this invention by a process for preparing a relief printing plate which comprises: (1) exposing to actinic radiation through an image-bearing transparency, a solid photopolymerizable thermoplastic stratum, of at least about 0.001 inch in thickness up to 0.10 inch (preferably, up to 0.03 inch) laminated to a support; (2) heating said stratum to a temperature between the flow temperatures of the exposed and the underexposed materials; and, (3) absorbing molten underexposed material into a porous matrix, preferably at least 0.002 inch in thickness, by pressing the latter into contact with said heated stratum leaving a relief image on said support. Steps (2) and (3) may be performed simultaneously if desired.

In a preferred embodiment of this invention, the photopolymerizable stratum will contain a polymeric binder, a polymerizable monomer and a photoinitiator so selected and used in such proportions that the resulting stratum will be solid below 40° C. The unexposed or underexposed parts of the stratum are thermally removable by having a flow temperature above 40° C. and below 260° C. Imagewise exposure to actinic radiation results in polymerization, with an accompanying increase in flow temperature, in the exposed areas without substantial polymerization and increase in flow temperature in the underexposed, complementary, adjoining, co-planar image areas. Thus, by heating the exposed stratum to a temperature intermediate between the flow temperatures of the exposed and the underexposed materials, the underexposed (unpolymerized) molten material may be removed by pressing the heated stratum against an absorbent surface such as a sheet of filter paper or felt. Upon removal of the unpolymerized material, there remains a relief image of the original transparency, suitable for direct use as a printing plate. While a small amount of the molten material is removed onto the surface of the absorbent surface, the large majority (e.g., about 80% or more) is absorbed into the pores. This factor is necessary to effect sufficient removal to form the relief image on the plate. The polymerized image remaining may be further hardened by a subsequent exposure to actinic radiation although this latter step is usually desirable only with certain compositions such as those with a higher ratio of polymerizable monomer to binder.

The solid photopolymerizable layer useful in this invention is preferably formed from a photopolymerizable composition which comprises:

(1) An organic polymeric binder, 10 to 90 parts by weight, (2) an ethylenically unsaturated compound containing 1 or more terminal ethylenic groups, having a boiling point above 100° C. at normal atmospheric pressure and being capable of forming a high polymer by photoinitiated addition polymerization, 10 to 90 parts by weight, and (3) a free-radical generating addition polymerization initiator, activatable by radiation, 0.001 to 10.0 parts by weight.

In addition to the above constituents, the photopolymerizable layer can contain, if desired, (4) a thermal polymerization inhibitor, 0.001 to 6.0 parts by weight.

Components (1) and (2) can be combined as a single material serving the function of both monomer and polymer in which case the ethylenic unsaturation can be present as an extralinear substituent attached to a thermoplastic linear polymer, such as polyvinyl acetate/acrylate, cellulose acetate/acrylate, cellulose acetate/methacrylate, N-acrylyloxymethyl polyamide, etc.

The photopolymerizable composition may also contain a chain transfer agent or polymerization accelerator including one or more of the chain transfer agents disclosed in Canadian Patent No. 632,188, Dec. 5, 1961, in the amounts given in that patent, especially a polyethylene glycol of a molecular weight of about 500 to about 20,000. Also, esters and ethers of such polyethylene glycols are useful.

The instant invention is not limited to particular photopolymerizable compositions and essentially any which meets the "flow" temperature requirements is useful. Suitable compositions which can be used are described in U.S. Patents 2,760,863 and 2,791,504. Other photopolymerizable compositions which can be used are described in the patents and U.S. applications of assignee as follows:

N-methoxymethyl polyhexamethylene adipamide mixtures of Saner, U.S. application, Serial No. 577,829, filed April 12, 1956, now abandoned; linear polyamide compositions containing extralinear N-acrylyloxymethyl groups of U.S. Patent 2,972,540; polyvinyl acetal compositions having the extralinear vinylidene groups of U.S. Patent 2,929,710; polyester, polyacetal or mixed polyester acetal mixtures of U.S. Patent 2,892,716; the fusible blends of selected organic-soluble, base-soluble cellulose derivatives with addition-polymerizable components and photoinitiators of U.S. Patent 2,927,022; fusible polyvinyl alcohol derivatives of U.S. Patent 2,902,365; 1,3-butadiene compositions of McGraw, U.S. application, Serial No. 833,928, filed August 17, 1959, now U.S. Patent 3,024,180.

The underexposed and, therefore, unpolymerized material of the photopolymerizable stratum is removed in a molten form when the stratum is heated after the exposure to its operating temperature. Preferably, the molten material is removed by pressing against a sheet of absorbent material such as felt or filter paper. Any absorbent material may be used which is capable of absorbing the moderately viscous composition used in a reasonably short time and that is fine-grained enough so as not to decrease resolution in the plate. Suitable porous matrices include other fabrics (e.g., porous nylons, polyesters, non-sticking fluorinated fabrics, etc.), blotting papers, porous metals, plastic foams, rubber foams, etc.

The surface of the porous material (matrix) which contacts the exposed and heated photopolymerizable stratum should have a maximum pore size of about 0.003 inch in order to insure adequate resolution in the plate. Only the pore size at the surface of the matrix is important in this respect; the pore size may be considerably greater (e.g., threefold greater) throughout the rest of the matrix since a larger pore size would be beneficial in improving capacity of the material to absorb the molten, underexposed material of the photopolymerizable stratum. In a particularly preferred embodiment, as described in Example IV, the matrix consists of two elements, a finely woven cloth whose small pore size contributes to high resolution, and a filter cloth pad of larger pore size which has high capacity for absorbing molten material. Another requirement of the matrix is that it be flexible enough that it can be easily deformed so as to follow the relief image as it is formed in the photopolymerizable stratum.

In addition, other mechanical means may be employed to effect further removal of the molten material.

The invention will be further illustrated by but is not intended to be limited to the following examples:

*Example I*

A coating composition was prepared from 60.0 g. of cellulose acetate butyrate, 40.0 g. of polyethylene glycol diacrylate, 88.0 g. of acetone containing 0.42 g. of phenanthrenequinone and 0.25 g. of Calcocid Green S Dye (CI 44,090). The cellulose acetate butyrate contained ca. 13% acetyl groups, ca. 37% butyryl groups and had a viscosity of 64 to 124 poises as determined by A.S.T.M. Method D–1343–54T in solution described as Formula A, A.S.T.M. Method D–871–54T. The polyethylene glycol diacrylate was derived from polyethylene glycol with an average molecular weight of 300.

The composition was coated on a 0.004 inch thick polyethylene terephthalate film at 0.048 inch wet thickness using a doctor-knife, and was dried at room temperature. The dried coating was laminated to an aluminum plate coated with an adhesive, the polyethylene terephthalate film was removed and the element was heated for one hour at 110° C., in a horizontal position, to secure good adhesion and to remove bubbles. A 0.001 inch thick polyethylene terephthalate film was laminated to the surface of the element formed to minimize oxygen inhibition of polymerization, and the element was exposed through a photographic negative using a Westinghouse type RS, 275 watt sunlamp at 12.5 cm. distance for 5 minutes. After exposure, the 0.001 inch polyethylene terephthalate film was removed. Two pieces of felt-like cotton filter cloth were then laid over the plate, and the assembly was placed in a Carver Laboratory press at 105° C. for two minutes under a pressure of 5 to 10 pounds per square inch. Water will flow through the cloth at a rate of 6.1 ml. per square centimeter per second under a head of 15 cm. of water, the cloth having a thickness of 2 mm. The felt-like material was stripped from the element surface while the assembly was still hot. The unexposed areas were removed by the cloth and a good relief image was formed on the aluminum plate.

A similar plate was exposed in the same manner, and developed by pressing filter paper against the plate with a flat-iron. This removed some of the unexposed material. Further amounts were removed by successive pressing of fresh sheets of filter paper with the iron, and a clean image was obtained by a final pressing, using nainsook cotton cloth between the plate and the iron.

*Example II*

A coating composition similar to that described in Example I was prepared except that the dye was omitted. The composition was coated on polyethylene terephthalate film to a wet thickness of 0.055 inch and was dried to yield a coating 0.017 inch thick. The element formed was laminated, coated side down, to an adhesive-bearing steel sheet, and was exposed through a negative in a vacuum frame (Fairchild exposure unit Model F386.1) with eight passes of the mercury arc maintained at a distance of 1⅜ inches, the arc moving at a rate of 75 inches per min. The polyethylene terephthalate film was removed and the unexposed material was transferred to the felt-like filter cloth by placing the element in a press for two minutes at 153° C. in the manner described in Example I. The relief image so obtained was inked in a proofing press and good prints were obtained on paper.

*Example III*

Biaxially oriented polyethylene terephthalate film, 0.004 inch in thickness, was treated to improve adhesion to photopolymerizable coatings by coating thereon 0.005 inch wet thickness of a solution of one gram of polypiperazine glycol urethane (prepared as described in Example I of U.S. Patent 2,731,446) in 1500 ml. of chloroform and drying. Thereafter, a solution of 50.0 g. of polybutyl methacrylate, 50.0 g. of polyethylene glycol diacrylate of Example I and 0.25 g. of 2-ethyl anthraquinone in 250 ml. of acetone was coated thereover which, after drying, yielded a layer 0.007 inch in thickness. A 0.001 inch polyethylene terephthalate film was laminated on the photopolymerizable surface. The element was then exposed while in a vacuum frame by 16 passes of the arc as described in Example II, but employing a ¼ inch deep honeycomb screen over the lamp to partially collimate the light. The cover sheet was removed. The unexposed areas were then removed onto filter cloth by placing the element in a press for one minute at 135° C. similar to the method of Example I. A relief image corresponding to the original negative was obtained.

*Example IV*

A 0.012 inch-thick coating was made on biaxially oriented polyethylene terephthalate film (which was treated for adhesion as described in Example III), by coating 0.060 inch wet thickness of a solution containing 10.0 g. of ethyl cellulose, 10.0 g. of triethylene glycol diacrylate and 0.07 g. of 2-ethylanthraquinone in 126 ml. of acetone. The ethyl cellulose was such that a 5% by weight solution in 80/20 toluene/ethanol had a viscosity of 4.5 centipoises at 25° C. The layer was dried and laminated with 0.001 inch polyethylene terephthalate film. After exposure through a negative as described in Example II, and removal of the laminated cover sheet, removal of the underexposed areas was made under pressure at 95° C., using a layer of finely woven fabric between a filter cloth pad described in Example I and the element surface. Samples were transferred using fabrics woven, respectively, of nylon, polyethylene terephthalate and regenerated cellulose fibers, all having about 100 x 100 to 250 x 250 threads per inch, nainsook cotton fabric having about 60 x 60 threads per inch and a nylon knitted fabric having about 60 loops per inch. In each of these cases, better removal of the unexposed material was obtained than when felt was used alone, resulting in a very clean, lint-free plate.

Removal of molten material was particularly good in the case of the regenerated cellulose. This was a closely woven, somewhat elastic fabric having holes formed by intersecting threads of less than 0.0003 inch across. This small pore size was responsible for excellent resolution in the processed printing plate while the elasticity of the fabric permitted a temporary expansion of the pore size which accounted for a reasonable rate of flow of molten material through the fabric. The other fabrics had hole sizes of 0.003 to 0.005 inch or more, and had the advantage of giving lint-free plates, but did not give the good resolution found with the regenerated cellulose fabric.

*Example V*

Onto a polyurethane-subbed polyethylene terephthalate film as described in Example III was coated a solution containing 50 g. of polyvinyl acetate, 50 g. of polyethylene glycol diacrylate (described in Example I), 0.25 g. of 2-ethylanthraquinone in 200 g. of methyl ethyl ketone and 20.0 g. of acetone, to give a layer of 0.007 inch dry thickness. An 8.6% by weight solution of the polyvinyl acetate had a viscosity of 90–110 centipoises at 20° C. A cover sheet was laminated as described in Example III and the element was exposed to 4 passes of the arc in the manner described in Example III. Upon removal of the cover sheet and transfer of the unexposed areas to filter cloth at 105° C., as described in Example I an excellent relief image was obtained.

*Example VI*

Onto a polyurethane-subbed polyethylene terephthalate film as described in Example III was coated a solution containing 12.5 g. of a copolymer of 90 parts of vinyl chloride and 10 parts of vinyl acetate, 12.5 g. of the polyethylene glycol diacrylate described in Example I and 0.125 g. of 2-ethylanthraquinone dissolved in 110 g. of acetone. The dried coating was 0.007 inch in thickness and a 0.001 inch thick polyethylene terephthalate film was laminated thereover. The element was then exposed through a negative for 8 passes of the arc as described in Example III, followed by removal of the laminated cover sheet. The unexposed material was transferred by pressing to filter cloth at 130° C. in the manner described in Example I. A good relief image corresponding to the original negative was obtained. A small amount of tacky unexposed material remained after transfer but had no effect on the quality of the letter-press printing plate so obtained. The plate was given an overall exposure of 60 seconds to the actinic radiation source while in a vacuum frame to harden this material.

*Example VII*

Onto a polyurethane-subbed polyethylene terephthalate film as described in Example III was applied a coating, 0.020 inch in wet thickness, of a solution containing 12.0 g. of polyethylene oxide of high molecular weight (a 5% by weight aqueous solution had a viscosity of 300 centipoises at 25° C.), 18.0 g. of polyethylene glycol diacrylate as described in Example I and 0.1 g. of the sodium salt of anthraquinone-2-sulfonic acid in 128 ml. of water. The dried coating was 0.003 inch in thickness and was laminated with a cover sheet as in Example III. After exposure as described in Example VI, the cover sheet was removed and the plate was developed by washing with water. A good image was obtained in areas of broad relief, but the swelling of the exposed polymer by the water development interfered with solution development of shadow dots which should appear as small holes in a high relief area. Another exposed element of similar composition was developed by thermal transfer to filter cloth of Example I at 72° C. under moderate pressure. Removal of only a small amount of material was obtained due to the high melt viscosity of the unexposed material at this temperature. This transfer was sufficient, however, to permit clean development of the shadow dots on subsequent washing with water.

*Example VIII*

Onto a polyurethane-subbed polyethylene terephthalate film as described in Example III was applied a coating, 0.030 inch in wet thickness, of a solution 20.0 g. of ethyl cellulose (as described in Example IV), 18.0 g. of polyethylene glycol diacrylate (as described in Example I) and 0.14 g. of 2-ethylanthraquinone dissolved in 90 g. of acetone. The dried coating was 0.005 inch in thickness and a sample of the coating was laminated, exposed and delaminated as described in Example VI. The exposed element was then developed by heating to 130° C. and wiping with absorbent cotton to physically remove molten material from underexposed areas. A satisfactory relief was obtained but a small amount of the cotton remained attached to the unexposed areas of the relief image. A better relief image was obtained by repeating the process on a similar sample element but using flannel cloth instead of cotton.

*Example IX*

Onto a polyurethane-subbed polyethylene terephthalate film as described in Example III was applied a coating, 0.025 inch in wet-thickness, of a solution containing 37.5 g. of a 30% by weight aqueous solution of cellulose acetate butyrate (as described in Example I), 10.0 g. of 2-ethylhexyl acrylate and 0.25 g. of benzoin methyl ether. The coating, after drying for 15 minutes at room temperature, was laminated with a 0.001 inch sheet of polyethylene terephthalate film, exposed as in Example II and delaminated. The unexposed areas were removed onto a filter cloth after one minute in a Carver press at 80° C. as described in Example I. A good relief image was obtained.

*Example X*

Onto a polyurethane-subbed polyethylene terephthalate film as described in Example III was applied a coating, 0.025 inch in wet-thickness, of a solution containing a 20% by weight acetone solution of ethyl cellulose (as described in Example IV), 10 g. of N-vinyl-2-pyrrolidone and 0.25 g. of benzoin methyl ether. The dried coating was given twice the amount of exposure described in Example III (i.e., 32 passes). The unexposed areas were removed onto filter cloth after one minute in a Carver press at 80° C. as described in Example I. A good relief image was obtained.

The example was repeated except that the N-vinyl pyrrolidone of the solution was replaced by 8.0 g. of 2-hydroxyethylmethacrylate. A similar exposure was given but with only 2 passes of the arc. A good relief image was obtained by transferring the unexposed areas at 77° C. in the manner described.

In the above examples, the abbreviation CI refers to the Colour Index, 2nd edition 1956, The Society of Dyers and Colourists, Dean House, Picadilly, Bradford, Yorkshire, England, and The American Association of Textile Chemists and Colorists, Lowell Technological Institute, Lowell, Massachusetts, U.S.A.

The exposure of the photopolymerizable element may be through a continuous tone transparency. For example, if a photopolymerizable stratum as described herein contains a dye which will attenuate the exposing radiation and is suitably exposed to the latter, the reverse side of the stratum may be contacted with the porous matrix described herein to absorb the underexposed areas thereby forming a relief, cameo-like image on such reverse side. The stratum can be either self supporting or coated on a support transparent to actinic radiation through which exposure is made. Such a technique is quite suitable for making relief maps or the like.

Photopolymerizable compositions useful in this invention are described in the patents and applications listed above. These compositions usually comprise polymeric binders, addition-polymerizable ethylenically unsaturated compounds, addition-polymerization initiators and, if desired, thermal, addition-polymerization inhibitors.

Suitable binders include the thermoplastic polymers disclosed in assignee's copending application, Burg and Cohen, U.S. Serial No. 831,700, filed August 5, 1959, now U.S. Patent 3,060,023. In that same application are also disclosed suitable fillers or reinforcing agents which are useful, for example, in improving the strength of the composition. Such materials must be either fusible or used in sufficiently small quantities so as to avoid interference with the transfer of heated, underexposed areas of the photopolymerizable stratum. Also, all materials present in the photopolymerizable stratum must, prior to exposure, be of sufficiently small particle size as to be penetrable into felt-like cotton filter cloth with an average pore size of about 0.0001 to 0.001 inch. Some materials, e.g., polyvinyl acetate co vinyl acrylate and polyvinyl acetate co vinyl methacrylate, are capable of serving simultaneously as both the polymeric binder and as the ethylenically unsaturated, addition polymerizable compound (i.e., an unsaturated polymer, capable of further polymerization).

Suitable addition-polymerizable ethylenically unsaturated compounds, in addition to the preferred triethylene glycol diacrylate and polyethylene glycol diacrylates with an average molecular weight of the diol precursor of 200 to 600, include vinylidene monomers, particularly the vinyl monomers described in U.S. Patent 2,791,504, column 17, line 62, to column 18, line 16, acrylic or methacrylic acid esters of diethylene glycol, triethylene glycol and higher polyalkylene glycols, e.g., methoxytriethylene glycol acrylate, ethylene glycol dimethacrylate, diethylene glycol diacrylate, methoxytriethylene glycol methacrylate, di- and triethylene glycol acrylates, and methacrylates, the acrylates, diacrylates, methacrylates and dimethacrylates of tetraethylene glycol, dipropylene glycol, and polybutylene glycols. Still other useful compounds include the diacrylates and dimethacrylates of ether-glycols which also contain a combined intrachain dibasic acid unit, e.g., the diacrylate or dimethacrylate of $$HOCH_2CH_2OCH_2CH_2O$$
$$—OCRCOOCH_2CH_2OCH_2CH_2OH$$

where R is a divalent hydrocarbon radical, e.g., methylene or ethylene. Other useful vinyl monomers include acrylate and methacrylate esters of polyhydroxy compounds, e.g., glycerol, pentaerythritol 1,2,4-butanetriol, 1,4:3,6-dianhydro-D-glucitol, glucose, mannose, sucrose, inositol, sorbitol and mannitol.

An addition polymerization initiator activatable by actinic radiation may be added in amount of from 0.001 to 10 parts by weight, preferably 0.001 to 0.2 part by weight per 100 parts by weight of the total composition. Examples of such initiators are vicinal ketaldonyl compounds such as diacetyl, benzil, etc., α-ketaldonyl alcohols such as benzoin, pivaloin, etc., acyloin ethers such as benzoin methyl or ethyl ethers, α-hydrocarbon substituted aromatic acyloins including α-methylbenzoin, α-allylbenzoin and α-phenylbenzoin. In addition, o-alkyl xanthate esters (U.S. Patent 2,716,633) are useful. Particularly preferred are the anthraquinone photo-initiators. In addition to anthraquinone other suitable initiators include 1-chloroanthraquinone, 2-chloroanthraquinone, 2-methylanthraquinone, 2-ethylanthraquinone, 2-tert-butylanthraquinone, octamethylanthraquinone, 9,10 phenanthrenequinone, 1,4-naphthoquinone, 1,2-benzanthraquinone 2,3-benzanthraquinone, 2-methyl-1,4-naphthoquinone, 2,3-dichloro-naphthoquinone, 1,4-dimethylanthraquinone, 2,3-dimethylanthraquinone, 2-phenylanthraquinone, sodium salt of anthraquinone alpha-sulfonic acid, 3-chloro-2-methylanthraquinone, retenequinone, 7,8,9,10-tetra-hydronaphthacenequinone, and 1,2,3,4-tetrahydrobenz(a)anthracene-7,12-dione.

A thermal addition polymerization inhibitor may be present in the preferred compositions. Suitable thermal polymerization inhibitors that can be used include p-methoxylphenol, hydroquinone and alkyl and aryl-substituted hydroquinones, tert-butyl catechol, pyrogallol, copper resinate, naphthylamines, betanaphthol, cuprous chloride, 2,6-di-tert-butyl-p-cresol, phenothiazine, nitrobenzene and dinitrobenzene. Other useful inhibitors include p-toluquinone and chloranil.

The base or support for the photopolymerizable elements of this invention are preferably flexible and composed of metal, e.g., aluminum or steel, but they can be rigid. They also can be made of various film-forming resins or polymers or cellulosic supports such as heavy glazed paper. Suitable supports are disclosed in U.S. Patent 2,760,863, column 5, lines 14 to 33. Various anchor layers, as disclosed in this patent, may be used to give strong adherence between the base and the photopolymerizable layer. The adhesive compositions disclosed in assignee's U.S. application of Burg, Serial No. 750,868, filed July 25, 1958, now U.S. Patent 3,036,913, are also very effective.

An antihalation material can be present in the support, or in a layer or stratum on the surface of the support, or can be contained in the anchor layer. With transparent or translucent supports, the antihalation material may be on the rear surface of the element. When antihalation material is used it preferably should be sufficiently absorptive of actinic light to permit reflectance from the support or combined support of no more than 35% of incident actinic light.

Various dyes, pigments and color forming components can be added to the photopolymerizable compositions to give varied results after removal of the underexposed portions. These added materials should, preferably, not absorb excessive amounts of light at the exposure wave length or inhibit the polymerization reaction.

The exposure can be accomplished by using a point or a broad actinic radiation source. The radiation source should furnish an effective amount of radiation at wavelengths at which the photoinitiator is active. This is ordinarily in the visible and ultraviolet region of the electromagnetc spectrum. Suitable sources include carbon arcs, mercury-vapor arcs, fluorescent lamps with special ultraviolet or visible-radiation-emitting phosphors, argon glow lamps, and photographic flood lamps. The point radiation sources are generally used at a distance of 20 up to about 40 inches from the photopolymerizable element. Broad radiation sources can be used at a distance up to 24 inches from the photopolymerizable surface. The distance may vary depending on the strength of the radiation source and the time required for exposure.

The printing reliefs made in accordance with this invention can be used in all classes of printing but are most applicable to those classes of printing wherein a distinct difference of height between printing and non-printing areas is required. These classes include those wherein the ink is carried by the raised portion of the relief such as in dry-offset printing and ordinary letterpress printing, the latter requiring greater height differences between printing and non-printing areas and those wherein the ink is carried by the recessed portions of the relief such as in intaglio printing, e.g., line and inverted halftone. The plates are useful for multicolor printing.

The term "underexposed" as used herein is intended to cover the image areas which are completely unexposed or those exposed only to the extent that there is addition polymerizable compound still present in sufficient quantity that the softening temperature remains substantially lower than that of the complementary exposed image areas. The term "flow" temperature, as applied to either an underexposed or exposed area of a photopolymerizable stratum, means the minimum temperature at which the area in question transfers and penetrates to a depth of 0.005 inch, within 15 seconds, under slight pressure, e.g., 1–5 lbs./in.$^2$, into a piece of felt-like cotton filter cloth having an average pore size of about 0.001 inch). The term "operating temperature" means the temperature at which the operation of removing the underexposed areas from the photopolymerizable stratum is actually carried out. The operating temperature is intermediate between the "flow" temperatures of the underexposed and exposed areas of a photopolymerizable stratum.

This process has the advantages that it is dry, i.e., no wet processing solutions are required, and the wash-out equipment previously used can be replaced with a simple hot press. Processing is inherently more rapid than in the case of washed-out plates and, therefore, continuous processing on a production scale is more feasible than in wash-out systems. Also, the image produced does not swell as it would with a wet processing technique; this permits improved development of shadow dots, particularly in a combination of wet and dry processing as described in Example VII. Another advantage is that thick photopolymerizable strata may be used without the danger (attendant in wet processing) of undercutting an incompletely exposed image area. An additional important advantage is that any suitable thermoplastic binder can be used rather than specific binders which are water soluble or solvent soluble. For many purposes, such as to secure good physical hardness, one would previously have had to synthesize expensive polymers that also have the required solubility, whereas a wide range of commercially available inexpensive binders can be used in the present invention.

The process of this invention is very useful in preparing gravure and intaglio plates from suitable negatives under suitable exposure conditions. All the relief images prepared according to the above examples could be used in actual printing operations, in flat bed or rotary presses.

What is claimed is:

1. A process for preparing a relief printing plate which comprises: (1) exposing to actinic radiation through an image-bearing transparency, a solid photopolymerizable thermoplastic stratum, of at least about 0.001 inch in thickness, attached to a support; (2) heating said stratum to a temperature between the flow temperatures of the exposed and the underexposed stratum materials; and (3) pressing a porous matrix into contact with said heated stratum to transfer at least about 80% of the molten unexposed material by absorption and leaving a relief image on said support, said matrix having at least a 0.002 inch thickness and having at its surface a maximum pore size of about 0.003 inch.

2. A process according to claim 1 where said porous matrix pore size, other than its surface pores, are greater than 0.003 inch.

3. A process according to claim 1 where said porous matrix has at least two layers of absorptive materials with the surface of the layer in contact with said thermoplastic having a pore size of no greater than about 0.003 inch.

4. A process according to claim 1 where said thermoplastic stratum is about 0.001 to 0.03 inch in thickness and said support is a metallic support.

5. A process according to claim 1 wherein the underexposed materials have a flow temperature between about 40° C. and about 260° C.

6. A process according to claim 1 wherein steps (2) and (3) are performed simultaneously.

References Cited by the Examiner

UNITED STATES PATENTS

| | | | |
|---|---|---|---|
| 3,060,023 | 10/1962 | Burg et al. | 96—28 |
| 3,060,024 | 10/1962 | Burg et al. | 96—28 |
| 3,060,025 | 10/1962 | Burg et al. | 96—28 |
| 3,060,026 | 10/1962 | Heiart | 96—28 |

NORMAN G. TORCHIN, *Primary Examiner.*

A. D. RICCI, *Examiner.*

C. BOWERS, *Assistant Examiner.*